United States Patent [19]

Namekawa et al.

[11] Patent Number: 4,592,054
[45] Date of Patent: May 27, 1986

[54] DECODER WITH CODE ERROR CORRECTING FUNCTION

[75] Inventors: Toshihiko Namekawa; Masao Kasahara; Kinichiro Tokiwa; Tohru Inoue, all of Osaka; Shigeru Okamura, Hyogo, all of Japan

[73] Assignee: Mitsubishi Denki Kabushiki Kaisha, Tokyo, Japan

[21] Appl. No.: 527,480

[22] Filed: Aug. 29, 1983

[30] Foreign Application Priority Data

Oct. 22, 1982 [JP] Japan .................................. 57-186375
Feb. 7, 1983 [JP] Japan .................................. 58-25598

[51] Int. Cl.⁴ ............................................. G06F 11/10
[52] U.S. Cl. ..................................................... 371/39
[58] Field of Search ........................ 371/37, 39, 41, 44

[56] References Cited

U.S. PATENT DOCUMENTS 3,781,795 12/1973 Zegers .................................... 371/41
3,958,220 5/1976 Marshall ................................ 371/39
4,276,646 1/1981 Haggard et al. ...................... 371/37
4,336,612 6/1982 Inoue et al. ........................... 371/39
4,358,848 11/1982 Patel ...................................... 371/39
4,397,022 8/1983 Weng et al. .......................... 371/37

OTHER PUBLICATIONS

H. T. Hsu, On the Decoding of a Class of Shortened Cyclic Codes for a Compound Channel, Information and Control, No. 1, Feb. 1973, pp. 79–88.

Primary Examiner—Charles E. Atkinson
Attorney, Agent, or Firm—Bernard, Rothwell & Brown

[57] ABSTRACT

A decoder wherein the received codes consisting of a plurality of binary bits are sent to the first and second corrector which are operating in parallel in order to correct random and burst errors respectively. An error-corrected output of the former is further determined whether it becomes all zeros or not by the syndrome calculation. If the result is affirmative, an output of the first corrector, otherwise an output of the second corrector is selected to be sent to the output terminal.

7 Claims, 7 Drawing Figures

DECODER WITH CODE ERROR CORRECTING FUNCTION

FIELD OF THE INVENTION

This invention relates to a decoder having error correcting functions for binary codes and more specifically to a decoder having correcting functions for random errors and burst errors in received binary codes.

BACKGROUND OF THE INVENTION

Binary codes transmitted through a transmission line are subject to being changed by various noise signals or disturbances causing random errors and/or burst errors before they are received and passed to a decoder. With a view to eliminating such errors from binary codes, various methods have already been proposed.

It is known that the Bose-Chandhuri-Hocquenghem Code (BCH) is one of the random error correcting codes. Relevant art may include "Error Correcting Codes" by W. W. Peterson, The M.I.T. Press, Cambridge, Mass., John Wiley, New York, 1961; "Algebraic Coding Theory" by E. R. Berlekamp, The M.I.T. Press, Cambridge, Mass. John Wiley, New York, 1968; and "A Method for Solving Key Equation for Decoding Goppa Codes" by Y. Sugiyama et al., Information and Control, Vol. 27, pp 87-99, 1975.

FIG. 1 is a block diagram of a cyclic error locating unit based on theory set forth in the above mentioned Peterson article. An error correction process of this cyclic error locating unit may be comprised in following three steps.

(a) A received vector $r(X) = r_0 + r_1 X + r_2 X^2 + \ldots + r_{n-1} X^{n-1}$ applied to an input terminal 1 is sent to a syndrome calculator 2 producing syndrome $S = S_1, S_2, \ldots, S_{2t}$.

(b) Results of step a are sent to a logic circuit 3 in order to find an error location polynominal $\sigma(X)$.

(c) Error location numbers $\beta_i$ are determined by finding a root of $\sigma(X)$.

The values $\sigma_1, \sigma_2, \ldots, \sigma_t$ for testing error locations determined by such steps are respectively input to the $\sigma$ registers $R_1, R_2, \ldots, R_t$ of the cyclic error location unit 4. Contents of the registers are input to the Galois Field Arithmetic Units (GFAU) $M_1, M_2, \ldots, M_t$ to be multiplied with root of $\sigma(X)$. Results of these multiplications are returned to the respective registers. Each output of the register is sent to a logic circuit $U_A$, which outputs "1" when the sum of them $$\sum_{i=1}^{t} \sigma_i \alpha^{il}$$

is equal to 1, otherwise, "0". This output from the circuit $U_A$ is sent to one input of an adder 6. The other input of the adder 6 is connected to a delay buffer 5. The buffer 5 stores the received vector signal sent from the input terminal 1. The bit $\gamma_{n-1}$ from the buffer is added to an output of the circuit $U_A$ using the adder 6 to produce an error corrected signal, which is then sent to an output terminal 7.

On the other hand, the Fire code is known as a typical burst error correction code, where P(x) represents a known polynominal of m order, and e represents the least positive integer with $X^e + 1$ to be divisible. The Fire code for correcting a single burst error up to a length of l is generated by a following general polynominal.

$$g(x) = P(x)(1 + X^{2e-1}) \tag{1}$$

Where $1 \leq m$, and $2l - 1$ is not divisible by e. The paper by W. W. Peterson, entitled "Error-Correcting Codes", MIT Press, Cambridge, Mass., New York, 1961 teaches us that the code length n is given by LCM (e, $2l - 1$). The burst error correcting capability of the Fire code is equal to $2 l/(m + 2l - 1)$. The paper by S. Lin, entitled "An Introduction to Error Correcting-Codes," Englewood Cliffs, N.J., Prentice Hall, Inc. also teaches us that $\eta$ is approximately equal to $\frac{2}{3}$, if $l = m$ and $m \to \infty$.

When discussing burst error correcting capability, it is known that a limit of burst error correcting capability of (n, k, l) code (register's limit) exists, where l is burst error correcting capability, n is length, and k is a number of symbols in case of burst error correcting code. The code which satisfies $l = (n - k)/2$ is the most optimum value, where $\eta = 1$. This indicates that the Fire code is not effective at the register's limit.

Some of the effective cyclic and shortened cyclic codes for correcting single burst error are listed in the following table. There are also described in the above mentioned paper by S. Lin i.e. "An Introduction to Error-Correcting Codes"; pp 119-129.

TABLE

| n−k−2l | CODE (n, k) | Burst error correcting capability | General polynomial |
|---|---|---|---|
| 0 | (7,3) | 1 | 35 |
|  | (15,9) | 3 | 171 |
|  | (15,11) | 4 | 1151 |
|  | (27,17) | 5 | 2671 |
|  | (34,22) | 6 | 15173 |
|  | (38,24) | 7 | 114361 |
|  | (50,34) | 8 | 224531 |
|  | (56,38) | 9 | 1505773 |
|  | (59,39) | 10 | 4003351 |
| 1 | (15,10) | 2 | 65 |
|  | (27,20) | 3 | 311 |
|  | (38,29) | 4 | 1151 |
|  | (48,37) | 5 | 4501 |
|  | (67,54) | 6 | 36365 |
|  | (103,88) | 7 | 114361 |
|  | (96,79) | 8 | 501001 |
| 7 | (31,25) | 2 | 161 |
|  | (63,55) | 3 | 711 |
|  | (85,75) | 4 | 2651 |
|  | (131,119) | 5 | 15163 |
|  | (169,155) | 6 | 55725 |
| 3 | (63,56) | 2 | 355 |
|  | (121,112) | 3 | 1411 |
|  | (164,153) | 4 | 6255 |
|  | (290,277) | 5 | 24711 |
| 4 | (511,499) | 4 | 10451 |
| 5 | (1023,1010) | 4 | 22365 | where,
n = Code length
k = Number of information digits

FIG. 2 is a block diagram of an error trapping decoder in connection with the theory described in the above mentioned Lin paper. In the first step, the transmitted information digits k coming from the input terminal 1 is passed to a modulo 2 adder 8 to be added with an output from a gate 11. An output from the adder is applied to a syndrome register 9 consisting of shift registers of (n−k) stages, and is also applied to a delay buffer register 5 of k stages. Where, k=5, n=15. In this step, the gate 11 is held in turned ON state, and gates 12 and 13 are held in turned OFF state.

In the second step, the weight bit outputs of register 9 are respectively input to a gate circuit 14 consisting a group of OR gates and its outputs are in turn applied to an all 0's check and control circuit 15. If outputs from circuit 14 are all 0's, the circuit 15 outputs "1", otherwise "0". The former means that the k received information digits in the buffer register 5 are error free. In this case, the gate 13 is turned ON and the k received information digits stored in the register 5 are sent to the output terminal 7 through the adder 5a and gate 13, while the gate 12 is held in turned OFF state.

If the output is in the latter case, the gate 11 is turned ON and the gates 12, 13 are held in turned OFF state and contents of the register 9 are shifted once to the left so that its output is fed back through the line 10.

With such operations, if the weight of the contents of the syndrome register 9 never goes down to 1 or less by the time the k received information digits have been read out of the buffer 5, then either an uncorrectable error pattern has occurred or correctable error pattern with errors not confined to n-k consecutive portion s has occurred.

Finally, the codes for correcting random and burst errors, such as the codes described in the paper entitled "Error-Correcting Code for a Compound Channel" by H. T. Hsu, T. Kasami and R. T. Chien, IEEE Trans. IT-14, No. 1, pp 135–138, 1968 are rather complicated and not effective.

OBJECTS OF THE INVENTION

It is an object of this invention to provide an error correcting decoder means for correcting code errors in received binary codes with high reliability.

It is another object of this invention to provide an error correcting decoder means for selecting an optimum error compensation arrangement in accordance with error pattern existing in received binary codes.

It is still other object of this invention to provide an error correcting decoder means for effectively compensating errors in received binary codes.

SUMMARY OF THE INVENTION

According to this invention, there are provided a first means for correcting random errors of received signal and a second means for correcting burst errors of received codes. There is concurrently executed a syndrome calculation check whether or not the output from the first means becomes all "0's", and the output of the first or second means is selectively gated to the output terminal in accordance with such check result.

DETAILED DESCRIPTION OF THE PREFERRED EMBODIMENT

Figures 3, 7:
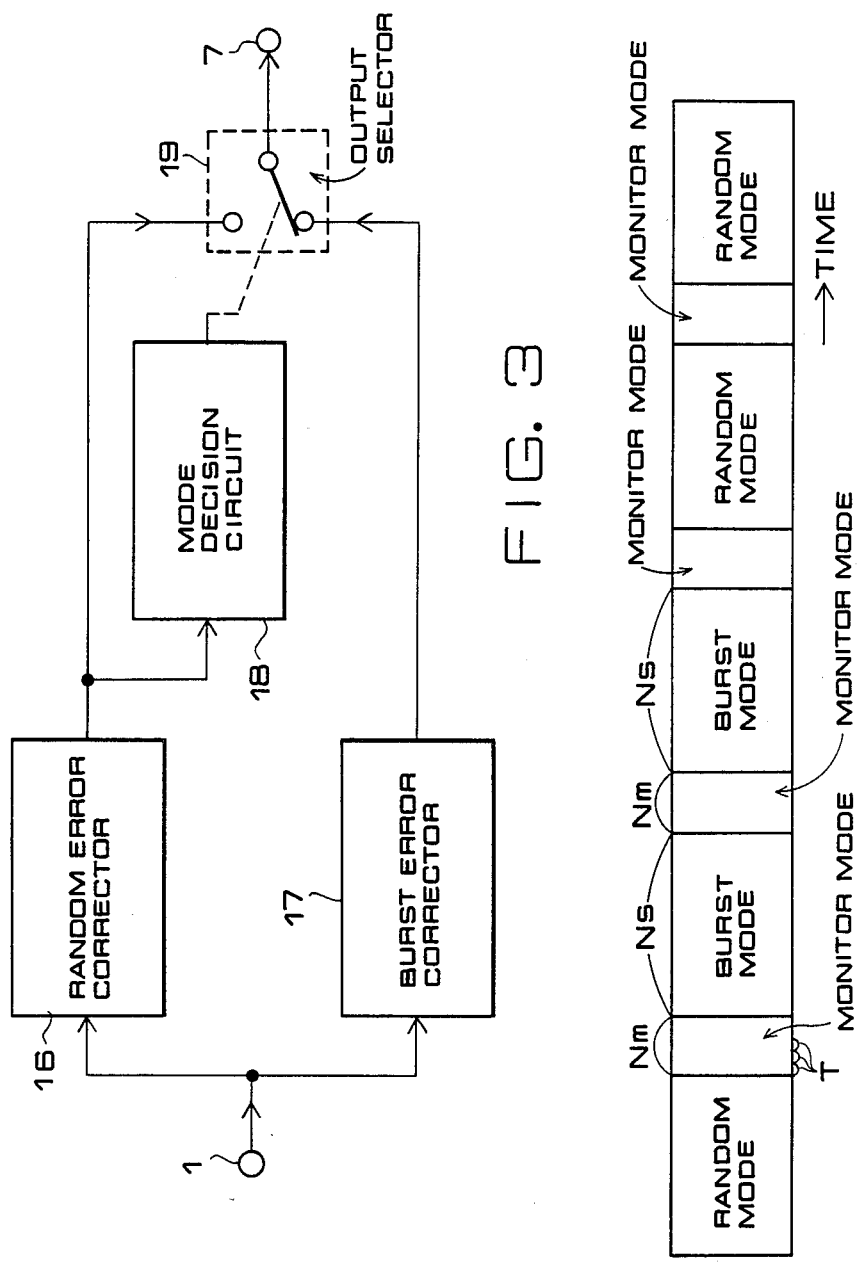
FIG. 3 is a general block diagram of the decoder embodying the present invention.
FIG. 7 shows the time chart of the operation mode of FIG. 6.

FIG. 3 is a general block diagram of the decoder embodying the present invention. A bit stream of BCH codes to be error-corrected is received through the input terminal 1 to be passed to a random error corrector 16 and a burst error corrector 17 and error-corrected therein before it is output. The output thus error-corrected by the corrector 16 is passed to a mode decision circuit 18 and one input of an output selector 19 which is simulated with a switch from its function. The other input of the selector 19 is supplied with the error-corrected BCH codes from the corrector 17. Selector 19 selects the output from the corrector 16 or 17 in accordance with the control of the circuit 18 and then sends it out via the output terminal 7.

Figure 4:
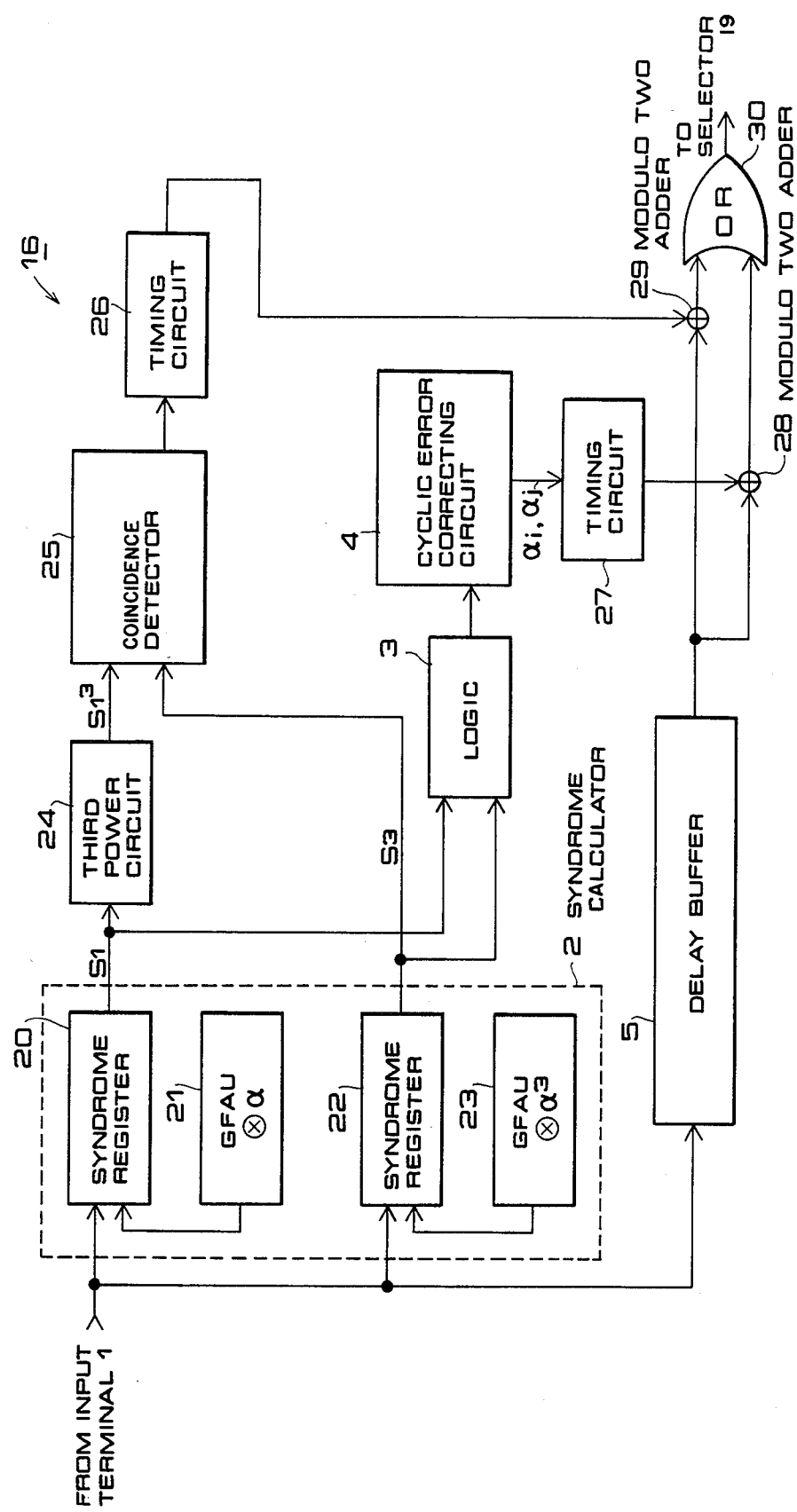
FIG. 4 shows detailed structure of the corrector shown in FIG. 3 capable of correcting errors in the BCH codes up to the double errors.

FIG. 4 shows detail structure of the corrector 16 which is capable of correcting errors in the BCH codes up to double errors. The BCH codes or received vector coming via the terminal 1, which is expressed, for example, as $$g(x) = 1 + x + x^2 + x^4 + x^5 + x^8 + x^{10},$$

is provided to syndrome registers 20 and 22 of the syndrome calculator 2, and to the delay buffer 5. The calculator 2 comprises also Galois field arithmetic units 21 and 23, and it performs following operations for the received vector.

$$S_1 = \sum_{i=0}^{n-1} \gamma_i \alpha_i,$$

$$S_2 = \sum_{i=0}^{n-1} \gamma_i (\alpha^2)^i,$$

$$S_3 = \sum_{i=0}^{n-1} \gamma_i (\alpha^3)^i,$$

$$S_4 = \sum_{i=0}^{n-1} \gamma_i (\alpha^4)^i,$$

$$S_5 = \sum_{i=0}^{n-1} \gamma_i (\alpha^5)^i,$$

and $$S_6 = \sum_{i=0}^{n-1} \gamma_i (\alpha^6)^i$$

Here, since it is required only to correct up to double errors, the required operation is executed for $S_1-S_4$ in above calculations. There are also relations, $S_2 = S_1^2$, $S_4 = S_2^2$, and $S_6 = S_3^2$ so that it is no longer necessary to calculate the syndrome of even suffix in the case of 2-element BCH codes. More practically speaking, the syndrome S is available by shifting one in the ith operation before multiplying with the element $\alpha$ of the unit 21 and adds such result to the total value of the preceding operation, namely, (i−1)th operation and then stores it in the register 20. Such operation is repeated for n−1 times. The similar operations is also carried out by using the register 22 and unit 23 for the syndrome $S_3$.

The syndrome $S_1$ is then transferred to a known third power circuit 24 and it is cubed to produce $S_1^3$. The circuit 24 may preferably be arranged by using the technique disclosed in the paper by Yamagishi and Imai entitled, "A method of Forming a Decoder for BCH Codes Using ROM", Articles of Electronics and Communication Society of Japan, Vol., J63-D, No. 12, pp 1034–1041.

The $S_1{}^3$ from the circuit 24 and $S_3$ from the register 22 are applied to a coincidence detector 24, which has an output made active when $S_1{}^3 = S_3$ and applied to a timing circuit 26. The circuit 26 holds its input signal before providing it at the timing position of $S_1 = \alpha$.

The syndrome $S_1$ is also applied to an error location logic 3 together with the syndrome $S_3$ sent from the register 22 which executes the following calculating function.

$$\sigma(x) = (1 + \beta_1 x)(1 + \beta_2 x)$$

$$= \sigma_0 + \sigma_1 x + \sigma_2 x^2$$

where, $\sigma_0 = 1$, $\sigma_1 = \beta_1 + \beta_2$, $\sigma_2 = \beta_1 \beta_2$. Roots of $\sigma(x)$ are expressed by $\beta_1{}^{-1}$, $\beta_2{}^{-1}$ of inverse number of error location. According to the Newton's identity, $$S_1 - \sigma_1 = 0$$

$$S_3 - \sigma_1 S_2 + \sigma_2 S_1 = 0.$$

Therefore, the answer can be obtained easily as indicated below.

$$\sigma_1 = S_1$$

$$\sigma_2 = S_1{}^2 + (S_3/S_1)$$

Figure 1:
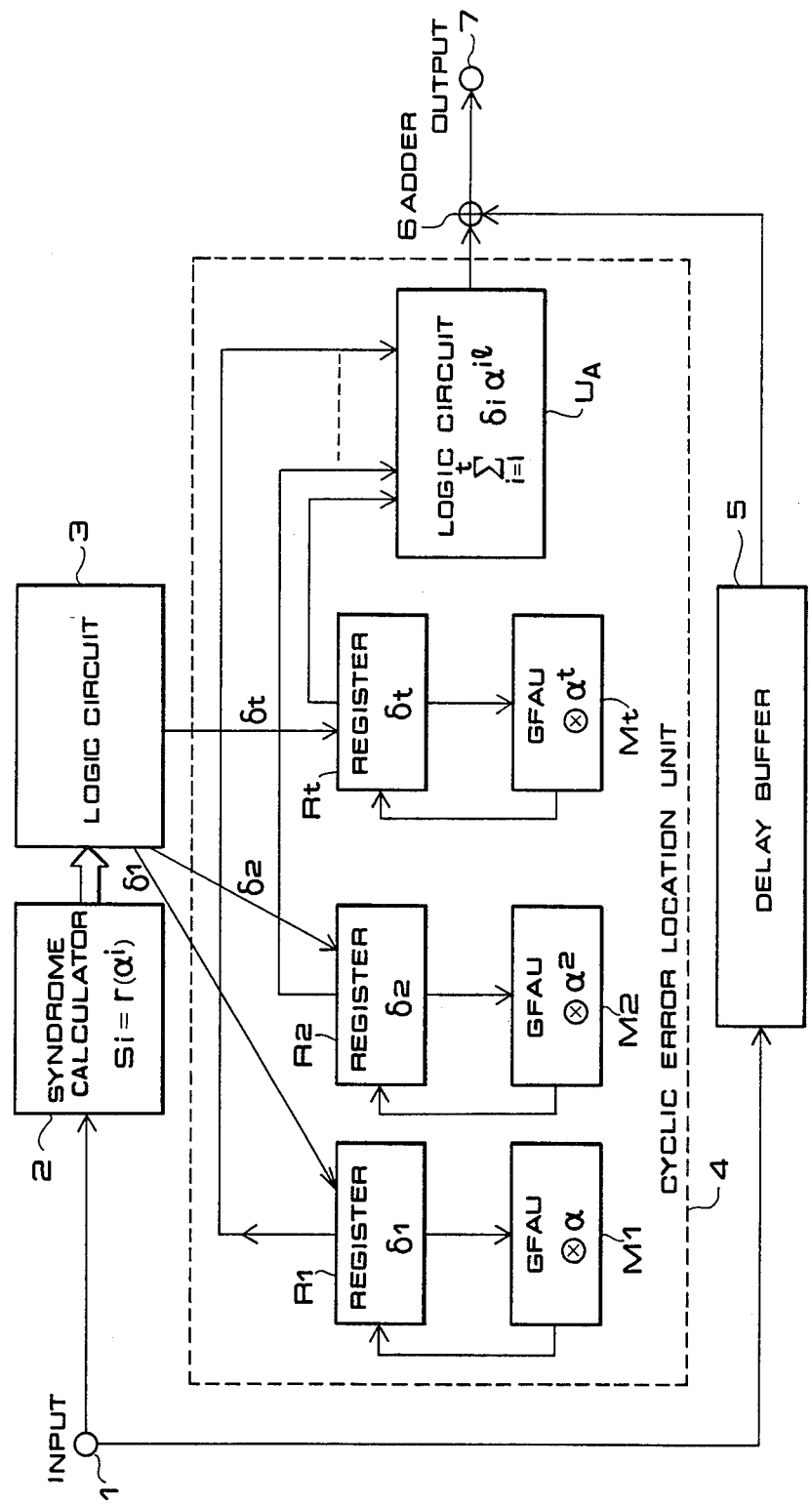
FIG. 1 is a conventional block diagram of a cyclic error locating unit based on Peterson's theory.

The values $\sigma_1$, $\sigma_2$ thus obtained are input to a known cyclic error correcting circuit 4, such as an arrangement disclosed by R. T. Chien in "Cyclic Decoding Procedure for the Bose-Chandhuri-Hocquenghem Code" IEEE Trans. on Information Theory, IT-10, pp 357–363, Oct. 1964, and explained in relation to FIG. 1. Referring now to FIG. 1, t stage $\sigma$ registers $R_1$, $R_2$, ..., $R_t$ store the values $\sigma_1$, $\sigma_2$, ..., $\sigma_t$ calculated in the 2nd step of decoder. Where, $\sigma_{\nu+1} = \sigma_{\nu+2} = \ldots \sigma_t = 0$, $\nu < t$. The t GFAU units $M_1$, $M_2$, ..., $M_t$ perform the multiplication once. Thereafter, $\nu_{n-1}$ is read from the buffer. When a series of multiplications is carried out, $\sigma_1 \alpha$, $\sigma_2 \alpha^2$, ..., $\sigma_\nu \alpha^\nu$ are respectively stored in the registers $R_1$, $R_2$, ..., $R_t$. The circuit $U_A$ carries out the calculation of $$\sum_{i=1}^{t} \sigma_i \sigma^{il} = \sigma_1 \alpha + \sigma_2 \alpha^2 + \ldots + \sigma_\nu \alpha^\nu$$

and if its result is equal to 1, an output becomes "1". Upon referring again to FIG. 4, the output from the circuit 4 is provided to a timing circuit 27.

The received codes or received words from the input terminal 1 are also provided to the delay circuit 5 to be delayed by a time corresponding to a delay time accumulated down to the circuit 4 and then to modulo two adders 28 and 29. Other input of the adders 28 and 29 are respectively connected to an output of timing circuits 27 and 26. The adder 29 adds a single error location $\alpha_i$ from the circuit 26 to an information from the buffer 5 in the polarity such that its error can be corrected and then supplies the resultant signal to one input of OR gate 30. On the other hand, the adder 28 adds the locations $\alpha_i$ and $\alpha_j$ from the circuit 27 to an output from the circuit 5 with the polarity such that its double errors can be corrected and resultant outputs are supplied to the other input of the OR gate 30.

It should be noted that when the Hamming distance d is equal to 7, triple or quadruple errors can also be corrected, and the syndrome which is not used in the instance described above may also be used in order to correct such errors.

An output from the OR gate 30 is supplied to the mode decision circuit 18 and selector 19 as explained in connection with FIG. 3.

Figure 5:
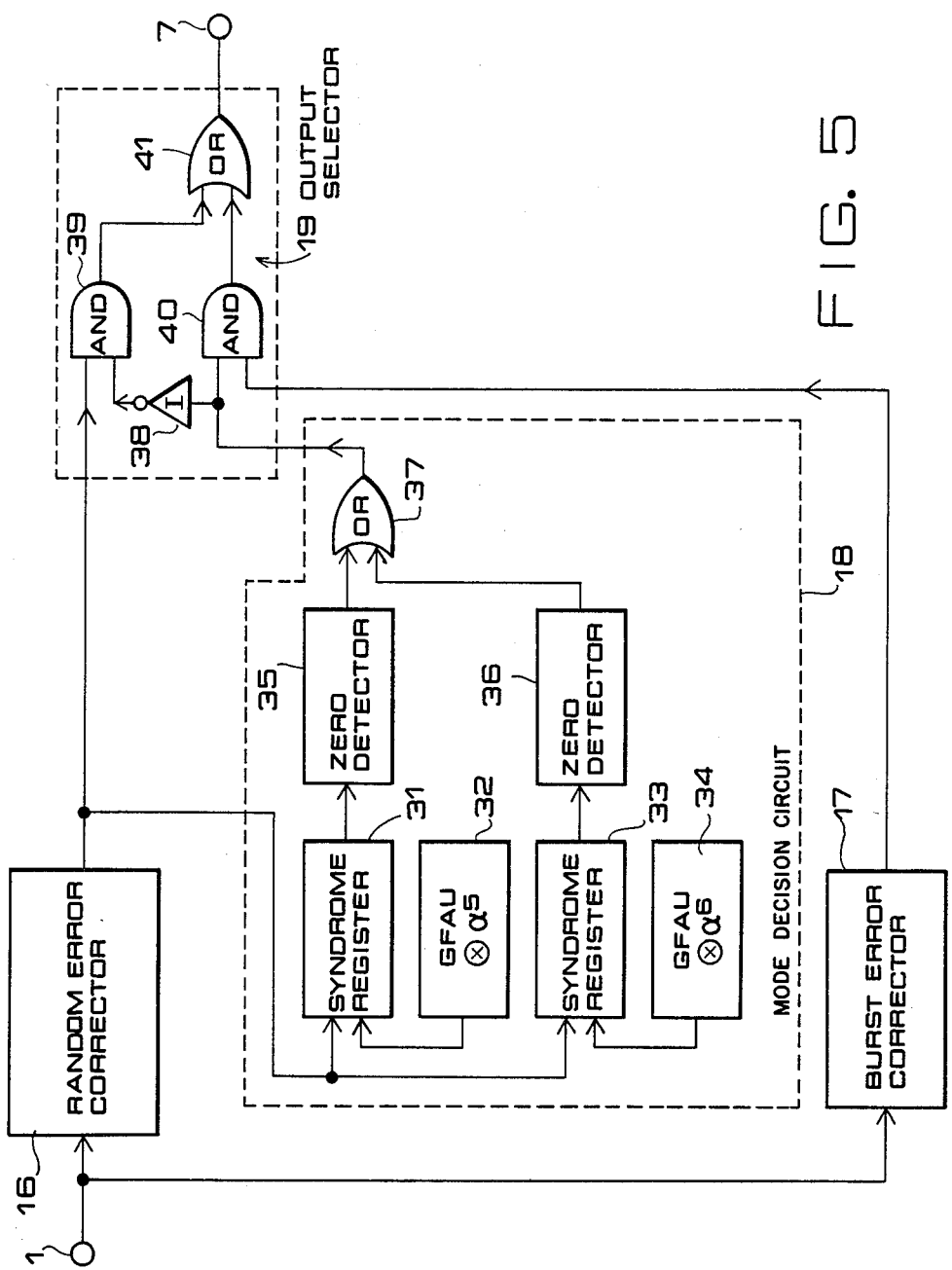
FIG. 5 shows detailed structure of the detector and selector shown in FIG. 3.

FIG. 5 shows detailed structure of the mode decision circuit 18 and selector 19. An output from the corrector 16 is supplied to the respective one input of syndrome registers ($S_5$) 31 and ($S_6$) 33 in the mode decision circuit 18. Since the signals $\alpha^5$ and $\alpha^6$ from Galois field units 32 and 34 are supplied to the other input of the registers 31 and 33, the calculations indicated below are executed by the same operations as explained in the calculator 2 of FIG. 1.

$$S_5 = \sum_{i=0}^{n-1} \gamma_i (\alpha^5)^i$$

$$S_6 = \sum_{i=0}^{n-1} \gamma_i (\alpha^6)^i$$

Thereafter, the results are respectively input to zero detectors 35 and 36.

When a single (or double) error exists in the received vector, the values of $S_5$ and $S_6$ are corrected by the corrector 16 and therefore these are respectively set to zero. Such zero output is detected by the detectors 35 and 36, which make the output active and supply such output to the selector 19 through an OR gate 37.

Figure 2:
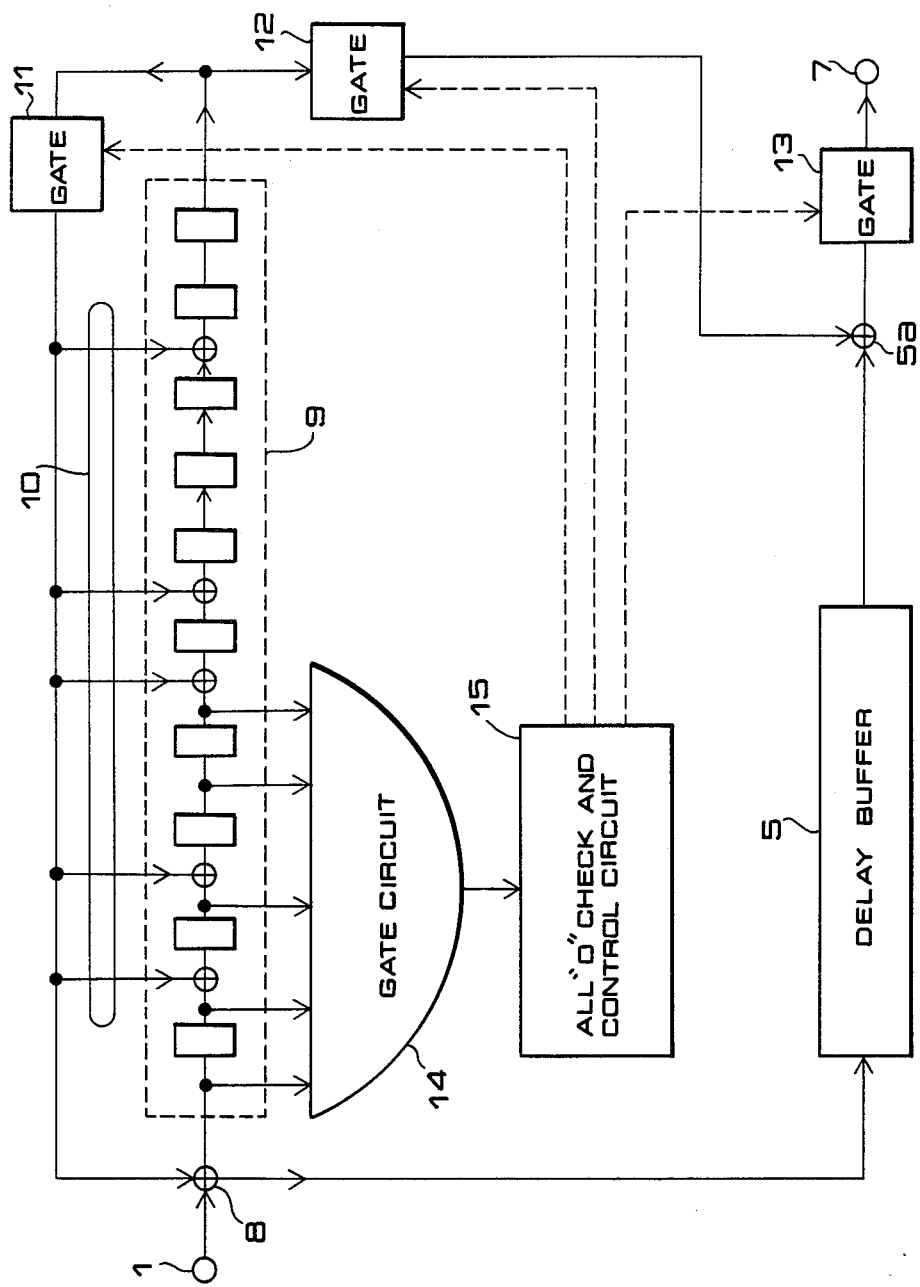
FIG. 2 is a conventional block diagram of an error trapping decoder in connection with the theory described in "Introduction to Error-Correcting Codes" by S. Lin.

The corrector 17 may have the known structure, such as shown in FIG. 2 and if triple or more high grade errors exist in the received vector, namely when at least either one of the $S_5$, $S_6$ is not zero, its output is selected by the selector 19 as will be described later.

Since there is a relation of $S_6 = S_3{}^2$, a value of $S_6$ may be calculated by squaring an output value of the corrector 16. A means for performing such calculation may be attained by the prior art as described in relation to the circuit 24.

In case an error trapping decoder as shown in FIG. 2 is used for correcting burst errors of BCH codes, burst errors up to a burst length $b = 5$ can be corrected. In this case, $n = 15$, $k = 5$, $d = 7$ and the feedback connection $g(x) = 1 + x + x^2 + x^4 + x^5 + x^8 + x^{10}$. Therefore, it is obvious that boundary of the register can be satisfied with the equal sign.

As shown in FIG. 5, the circuit 18 supplies an input signal to one input of an AND gate 40 and via inverter 38 to an AND gate 39. The other input of the AND gate 40 is supplied from the corrector 17. The other input of the AND gate 39 is connected to the output of the corrector 16. The outputs from AND gates 39 and 40 are passed to the output terminal 7 through an OR gate 41. For example, if an output of mode decision circuit 18 is zero, the AND gate 39 is kept open and the AND gate 40 is blocked so that an output of corrector 16 is gated to the output terminal 7 through the OR gate 41. If the output of the detector 18 becomes "1", the AND gate 39 is blocked, while the AND gate 40 is kept open so that the output from the corrector 17 is gated to the terminal 7 through the OR gate 41.

Figure 6:
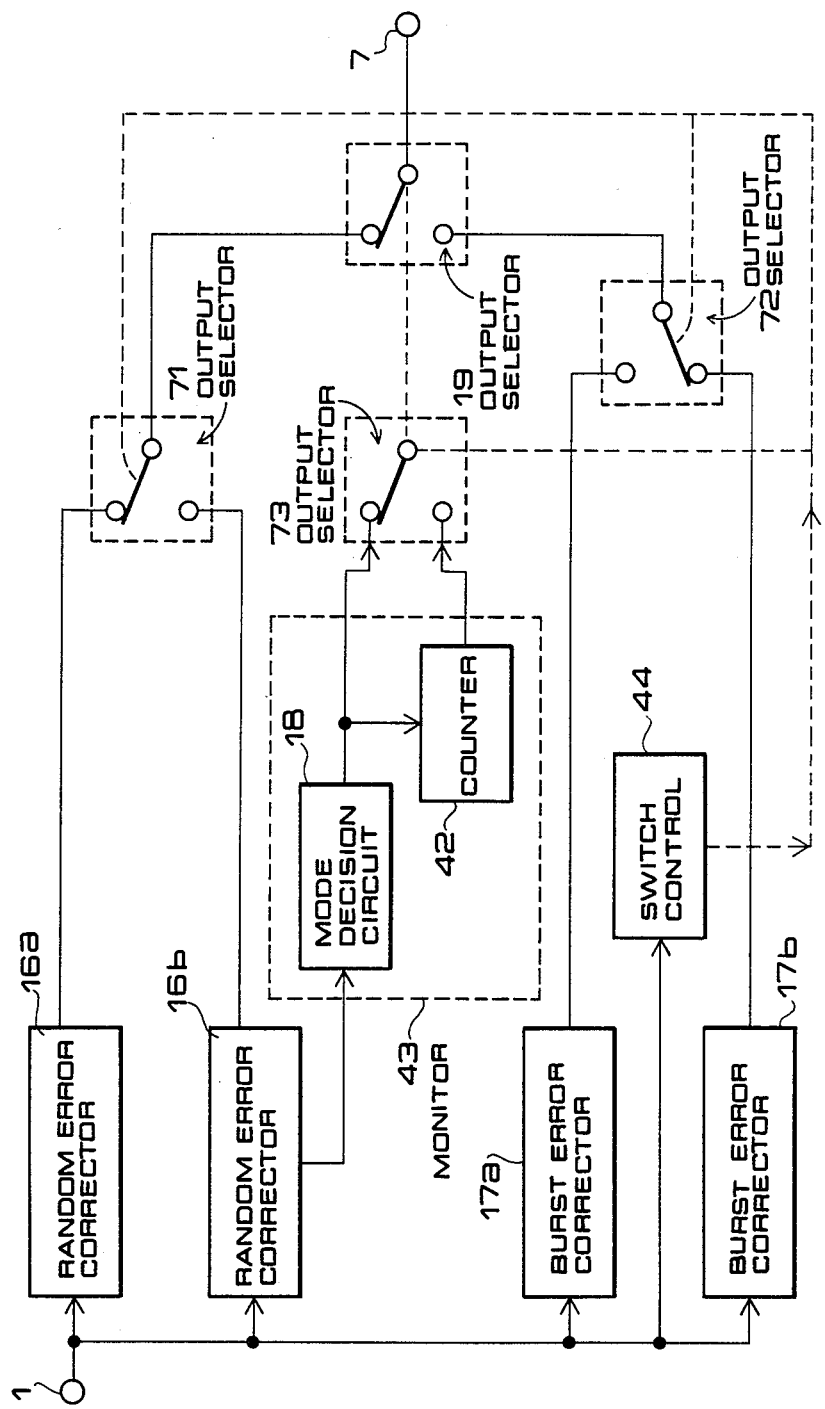
FIG. 6 is a block diagram of a second embodiment of the present invention.

FIG. 6 is a block diagram of a second embodiment of present invention. The elements which are the same as those in FIG. 3 are given the same reference numbers and some elements which are duplicated are distinguished by a suffix letter. A switch 71 is provided for selecting an output between random error correctors 16a and 16b. A switch 72 is also provided for selecting an output between burst error correctors 17a and 17b. In addition, a counter 42 which counts a number of outputs of the mode decision circuit 18 is provided and a switch 73 is provided for selecting output between the outputs of the circuit 18 and counter 42, both forming a monitor 43. A switch control 44 is also provided to make the switch positions of selectors 19, 71–73 to be changed periodically in synchronization with an input signal as shown in FIG. 7.

At the initial condition or monitor mode of operation, the selectors 71, 72, 73 respectively select the outputs of the correctors 16b, 17a and circuit 18, and the selector 19 selects an output of the selector 71 such that an output of the corrector 16b is led to the terminal 7. The mode decision circuit 18 of the monitor 43, when detecting a multiple of t+1 order or higher errors in the monitor mode, generates a control signal so that the selector 19 is switched to select an output of selector 72. Therefore, an output from the corrector 17a is passed to the terminal 7 through the selectors 72 and 19.

When a multiple of t order or less errors is detected, the control signal from the mode decision circuit 18 of the monitor 43 is passed to the selector 19 through the selector 73 so that the selector 19 is set to the location as shown in the FIG. 3. Thereby an output of the corrector 16b is led to the terminal 7 through the selectors 71 and 19.

The counter 42 counts up the number of output operations of the corrector caused by random errors of t+1 multiple order or higher being detected within the monitor time period ($N_m \times T$). When this count value exceeds a specified value, such as $N_m/2$, an input vector is decided to have burst errors. When it does not exceed such value, the input vector is decided to have random errors. Thereafter the monitor mode is concluded by the switch control 44 operating the output selector 73 to select the output of the counter 42. In the following period of normal operation, the selector 19 is connected to the selector 72, if the burst error correction mode is selected by the counter 42, while the selector 19 is connected to the selector 71 if the random error correction mode is selected by the counter 42. Also, the switches 71 and 72 are respectively connected to the correctors 16a and 17b by the control of switch control 44.

In the normal operation period, the corrector 16a or 17b performs correction with the maximum correcting capability of the code thereof. Thereafter, the monitor mode appears again and checks the incoming code condition in order to prepare for the next operation period.

FIG. 7 shows the time chart of the operation mode of FIG. 6. When a time interval required to complete one code word input is indicated by T, the monitor mode continues for the period $N_m \times T$. Thereafter, the random or burst mode continues for the period $N_s \times T$. Where $N_m$ is the suitable time period required for deciding whether the incoming codes have random errors or burst errors, while $N_s$ is the time which is long enough during which the input vector condition may not be changed significantly. As shown in the figure, the monitor mode and normal mode are interleaved alternatively because the receiving condition of the input vector sometimes changes as the time goes by. For this reason, the normal mode is interrupted by the monitor mode in order to adapt to its receiving condition such that the system may take the most favorable correction mode.

Explained above is the technique for correcting δ random errors satisfying the relation, where δ<t when the error correction capability is considered as t. However, if the complete codes are not available, it does not always guarantee to provide the code vector whatever errors of t order may be included therein. In such a case, such modification may be taken that the syndrome check of the present invention is carried out before the error correction mode of the device is switched from the random correction mode to the burst correction mode.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A binary code decoder comprising;
    first correcting means for correcting random errors up to a predetermined number of bits in received binary codes,
    second correcting means for correcting burst errors more than said predetermined number of bits and up to a maximum burst error correcting capability of the code in said binary codes,
    decision means for checking code errors in the correction output signal from said first correcting means to provide a check resultant signal, and
    selecting means which selects either output from said first or second correcting means in accordance with said resultant signal from said decision means indicating absence or presence, respectively, of code errors in the correction output signal from said first correcting means.

2. The decoder means according to claim 1, wherein said decision means comprises a first calculating means for calculating a syndrome from an output signal of said first correcting means, and detector means for deciding whether or not all outputs from said first calculating means are zero's; and said selecting means selects the output of said first correcting means when all outputs of said first calculating means are zero's, and otherwie selects the output of said second correcting means.

3. The decoder according to claim 1, wherein said first correcting means comprises;
    second calculating means for calculating a syndrome of the binary codes,
    logic means for solving the calculation result of this second calculating means by the Newton's identity, and
    means for generating correction codes in correspondence with error code in said binary codes under the control of said logic means.

4. In the decoder according to claim 1, wherein said second correcting means comprises;
    an error trapping decoder for correcting burst errors in said binary codes, and
    adder means for correcting errors in said binary codes by adding outputs from said error trapping decoder thereto.

5. A decoder comprising;

first correcting means for correcting random errors up to a maximum random error correcting capability of the code in received binary codes, second correcting means for correcting random errors up to the maximum random error correcting capability of the code in said received binary codes, third-correcting means for correcting burst errors more than said maximum random error correcting capability and up to a maximum burst error correcting capability of the code in said received binary codes, fourth correcting means for correcting burst errors more than said maximum random error correcting capability and up to said maximum burst error correcting capability of the code in said received binary codes, monitor means responsive to the output of said second correcting means having more than a predetermined number of errors for proucing an output, first and second selecting means which resepctively select the output of either the first or second correcting means and the output of either the third or fourth correcting means during respective monitor and normal modes, and third selecting means which selects the output of either said first or second selecting means in accordance with the output of said monitor means indicating said received binary codes having less than or more than, respectively, of said predetermined number of errors.

6. In the decoder according to claim 5, wherein a monitor means comprises;

decision means for detecting errors in an output of said second correcting means, a counter for counting the outputs of a decision result from decision means, and control means for generating a control signal to change the select position of said third selecting means when the count value of said counter reaches a predetermined value.

7. In the decoder according to claim 5, wherein said monitor means is controlled in such a way that the operation for error detection is cyclically carried out.

* * * * *

UNITED STATES PATENT AND TRADEMARK OFFICE
CERTIFICATE OF CORRECTION

PATENT NO. : 4,592,054

DATED : May 27, 1986

INVENTOR(S) : Toshihiko Namekawa et al.

It is certified that error appears in the above-identified patent and that said Letters Patent is hereby corrected as shown below:

On the first page, under "Foreign Application Priority Data", the date of "Feb. 7, 1983" should read --Feb. 16, 1983--.

Column 5, line 7, the numeral "24" should be --25--.

Signed and Sealed this

Twentieth Day of January, 1987

Attest:

DONALD J. QUIGG

*Attesting Officer*  *Commissioner of Patents and Trademarks*